(12) United States Patent
Lee et al.

(10) Patent No.: US 11,799,458 B2
(45) Date of Patent: Oct. 24, 2023

(54) FLIP FLOP CIRCUIT

(71) Applicant: SAMSUNG ELECTRONICS CO., LTD., Suwon-si (KR)

(72) Inventors: Young O Lee, Hwaseong-si (KR); Min Su Kim, Hwaseong-si (KR); Jeong Jin Lee, Hwaseong-si (KR); Won Hyun Choi, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/693,026

(22) Filed: Mar. 11, 2022

(65) Prior Publication Data

US 2022/0393671 A1 Dec. 8, 2022

(30) Foreign Application Priority Data

Jun. 8, 2021 (KR) .................. 10-2021-0074061
Aug. 20, 2021 (KR) .................. 10-2021-0110439

(51) Int. Cl.
*H03K 3/012* (2006.01)
*H03K 3/037* (2006.01)
*H03K 3/017* (2006.01)

(52) U.S. Cl.
CPC .......... *H03K 3/0375* (2013.01); *H03K 3/012* (2013.01); *H03K 3/017* (2013.01)

(58) Field of Classification Search
CPC ....... H03K 3/0375; H03K 3/012; H03K 3/017
See application file for complete search history.

(56) References Cited

U.S. PATENT DOCUMENTS

| | | | |
|---|---|---|---|
| 6,608,513 B2 | 8/2003 | Tschanz et al. | |
| 6,937,079 B1 | 8/2005 | Zhao et al. | |
| 7,443,218 B2 | 10/2008 | Onouchi et al. | |
| 7,671,653 B2 | 3/2010 | Harris et al. | |
| 7,746,138 B2 | 6/2010 | Sekine et al. | |
| 8,063,685 B1 | 11/2011 | Narula et al. | |
| 2005/0097492 A1* | 5/2005 | Matsumura | H01L 27/11807 257/E27.108 |
| 2007/0152726 A1* | 7/2007 | Wu | G06F 1/04 327/291 |
| 2013/0207701 A1* | 8/2013 | Kitagawa | H03K 5/1506 327/158 |
| 2018/0062625 A1* | 3/2018 | Agarwal | H03K 19/0002 |

FOREIGN PATENT DOCUMENTS

JP 11055081 A2 2/1999

* cited by examiner

*Primary Examiner* — Sibin Chen
(74) *Attorney, Agent, or Firm* — Fish & Richardson P.C.

(57) ABSTRACT

A pulse-based flip flop circuit includes a pulse generator generating a pulse signal and an inverted pulse signal, a scan hold buffer holding a scan input signal for a delay time, and a latch circuit including an intermediate node receiving either a data signal or the scan input signal responsive to a scan enable signal, the pulse signal and the inverted pulse signal. The pulse generator circuit includes a direct path providing a clock signal as a direct path input to a NAND circuit; a delay path including a number of plural stages that delay the clock signal and provide a delayed clock signal as a delay path input to the NAND circuit that performs a NAND operation on the direct path and delay path inputs to generate the inverted pulse signal; and a feedback path providing the pulse signal to a first stage among the stages of the delay path.

18 Claims, 11 Drawing Sheets

FLIP FLOP CIRCUIT

CROSS-REFERENCE TO RELATED APPLICATIONS

This application claims priority under 35 U.S.C. § 119 to Korean Patent Application No. 10-2021-0074061 filed on Jun. 8, 2021, and Korean Patent Application No. 10-2021-0110439 filed on Aug. 20, 2021, the collective subject matter of which 1 is hereby incorporated by reference in its entirety.

BACKGROUND

The inventive concept relates generally to flip flop circuits, and more particularly to pulse-based flip flop circuits.

Application processors used in mobile devices are required to operate at high speed (e.g., at a high operating frequency) with relatively low power consumption. In order to increase the operating speed of an application processor, high-speed flip flop circuits (hereafter simply, "flip flops") may be used, particularly in relation to timing-sensitive signal path(s), such as (e.g.,) certain data paths. In one aspect, the operating speed of a flip flop may be a function of a Data-to-Output (Q) delay, or DQ delay. Here, a DQ delay may be defined as the sum of a setup time and a Clock-to-Output delay, or CQ delay.

In many digital designs, flip flops having a so-called master-slave structure may be used. Such master-slave flip flops are comparatively easy to implement, operate with low power consumption and provide excellent operating stability. However, master-slave flip flops suffer from relatively long setup times duration which input data is prepared (or settles) before an active clock edge may be applied. Accordingly, master-slave flip flops exhibit increased DQ delays due to increased setup times.

SUMMARY

Embodiments of the inventive concept provide pulse-based flip flop circuits exhibiting high operating speed and low power consumption.

In one embodiment, the inventive concept provides a pulse-based flip flop circuit including; a pulse generator circuit configured to generate a pulse signal and an inverted pulse signal, a scan hold buffer configured to hold a scan input signal for a delay time, and a latch circuit including an intermediate node receiving one of a data signal and the scan input signal provided by the scan hold buffer in response to a scan enable signal, the pulse signal and the inverted pulse signal. The pulse generator circuit includes; a direct path providing a clock signal as a direct path input to a NAND circuit, a delay path including a number of stages configured to delay the clock signal and provide a delayed clock signal as a delay path input to NAND circuit, wherein the NAND circuit performs a NAND operation on the direct path input and the delay path input to generate the inverted pulse signal, and a feedback path providing the pulse signal to a first stage among the number of stages of the delay path.

In another embodiment, the inventive concept provides a pulse generator circuit configured to provide a pulse signal to at least one of a scan hold buffer circuit and a latch circuit of a pulse-based flip flop circuit. The pulse generator circuit includes; a direct path receiving a clock signal and providing the clock signal as a direct path input to a NAND circuit, a delay path receiving the clock signal and including an odd number of series-connected stages including at least a first stage, an intermediate stage, and a last stage, a feedback path providing the pulse signal as a first feedback signal to the first stage, and an inverter inverting an inverted pulse signal to provide the pulse signal, wherein the series-connected stages delay the clock signal to provide a delay path input to the NAND circuit, and the NAND circuit performs a NAND operation on the direct path input and the delay path input to generate the inverted pulse signal.

In another embodiment, the inventive concept provides a pulse-based multi-bit flip flop circuit including; a first pair of adjacent metal lines including a first metal line and a second metal line bounding a first row extending in a first horizontal direction, a second pair of adjacent metal lines including the second metal line and a third metal line bounding a second row extending in the first horizontal direction, wherein the second row is adjacent to the first row in a second horizontal direction that intersects the first horizontal direction, a first divisional pulse generator, a first latch circuit, and a first scan hold buffer arranged in the first horizontal direction in the first row, and a second divisional pulse generator, a second latch circuit, and a second scan hold buffer arranged in the first horizontal direction in the second row.

BRIEF DESCRIPTION OF DRAWINGS

The making and use of the inventive concept may be more clearly understood upon consideration of the following detailed description together with the attached drawings in which.

DETAILED DESCRIPTION

Throughout the written description and drawings, like reference numbers are used to denote like or similar elements and components.

Figure 1:
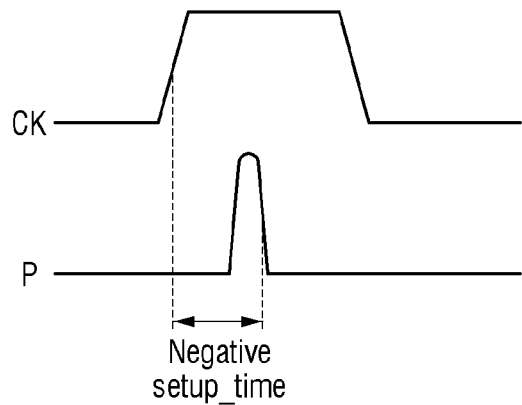
FIG. 1 is a signal timing diagram illustrating a relationship between a clock signal and a pulse signal.

Figure (FIG. 1 is a signal timing diagram illustrating a relationship between a clock signal (CK) and a pulse signal (P) as relates to the operation of a pulse-based flip flop according to embodiments of the inventive concept.

Referring to FIG. 1, a "setup time" may be defined as a period of time beginning at a rising edge of a clock signal CK and extending to a time at which a data signal D is captured by a latch circuit in the flip flop circuit. In a pulse-based flip flop circuit, a pulse signal P may occur (e.g., be activated) following an active edge of the clock signal CK (e.g., a rising edge and/or a falling edge). Upon receiving the activated pulse signal P, a level-sensitive latch circuit may capture the data signal D to perform a latch operation. In this regard, even when the data signal D is prepared after an active edge of the clock signal CK, the operation of the pulse-based flip flop may nonetheless be performed. In this manner, a DQ delay associated with the pulse-based flip flop circuit may be kept constant.

Further, in relation to the pulse-based flip flop, even when the clock signal CK is skewed, the DQ delay may be kept constant because the latch circuit operates in response to the pulse signal P. Accordingly, in environments wherein a clock skew margin varies from a preset value, the setup time may be pre-set based on a clock signal skew level. Thus, when the setup time is pre-set based on the clock signal skew level, the pulse-based flip flop associated with the signal diagram of FIG. 1 may be understood as having a negative setup time (or a negative setup characteristic). With this negative setup characteristics, the pulse-based flip flop may operate at relatively higher speed, thereby improving the overall performance of an application processor incorporating same.

Figure 2:
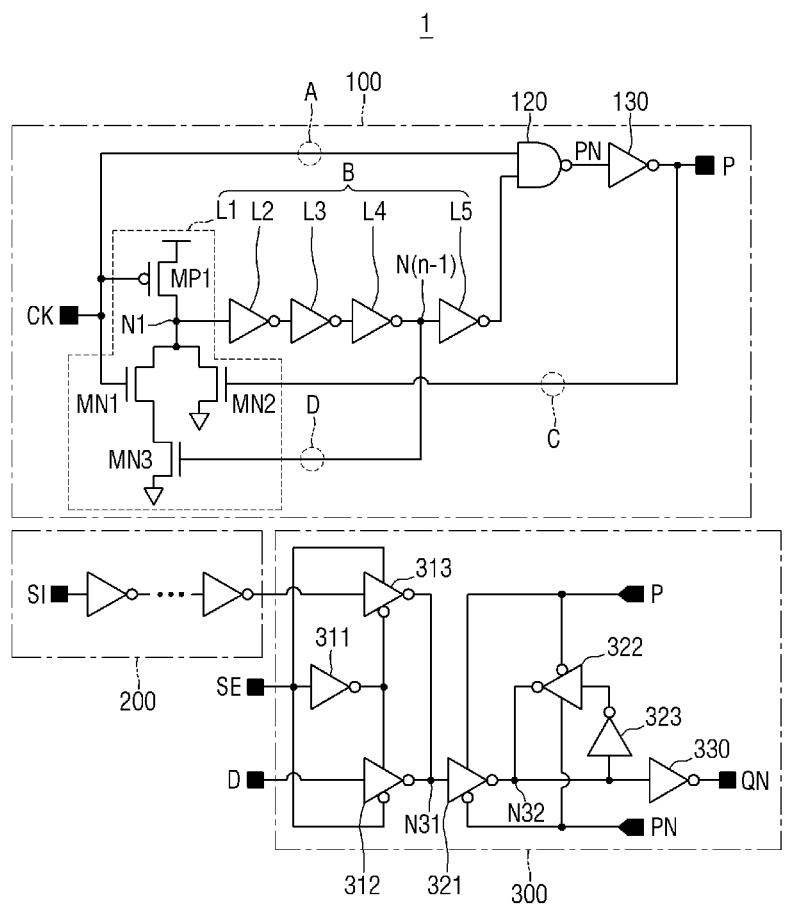
FIG. 2 is a circuit diagram illustrating a pulse-based flip flop circuit according to embodiments of the inventive concept.
Figure 3:
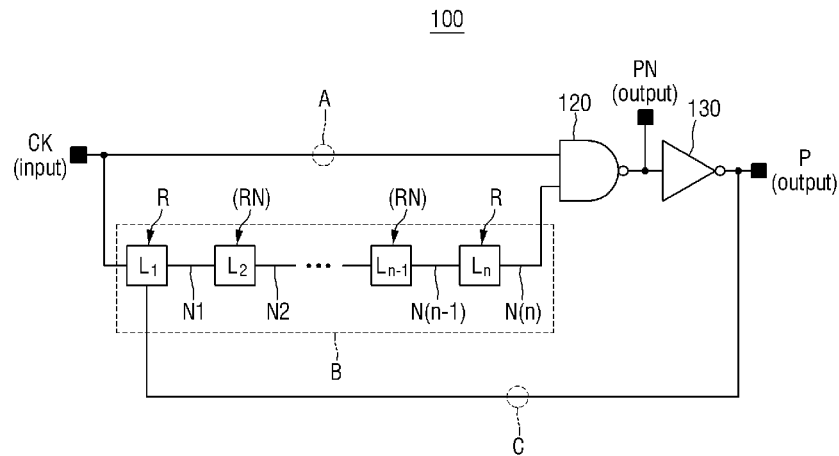
FIG. 3 is a conceptual diagram further illustrating the pulse generator of FIG. 2.

FIG. 2 is a circuit diagram illustrating a pulse-based flip flop circuit 1 according to embodiments of the inventive concept, and FIG. 3 is a conceptual diagram further illustrating the pulse generator 100 of FIG. 2.

Referring to FIG. 2, the pulse-based flip flop circuit 1 generally includes a pulse generator circuit 100, a scan hold buffer circuit 200 and a latch circuit 300.

Referring to FIG. 3, the pulse generator circuit 100 may be conceptually understood as including a NAND circuit 120 that outputs an inverted pulse signal PN, and an inverter circuit 130 that outputs a pulse signal P (e.g., an inverted (or reinverted) version of the inverted pulse signal PN), wherein a direct path 'A' may connect an input (e.g., an input receiving the clock signal CK) with a first input of the NAND circuit 120, a delay signal path 'B' may connect to a second input of the NAND circuit 120, and a feedback path 'C' may connect an output of the inverter 130 with a point (or element) along the delay path B.

The delay path B may be further understood as including a number of stages (e.g., L1, L2 . . . Ln−1 and Ln, hereafter inclusively, "L1 to Ln") greater than two (e.g., five). In some embodiments, each of the stages L1 to Ln may be implemented as a delay inverter element that receives an input signal, and inverts the received input signal to generate an output signal—that may be applied to a next stage as the input signal.

In this regard, the feedback path C may connect to an output of the pulse generator circuit (e.g., the output of the inverter 130) with the first stage L1 (e.g., a first delay inverter element) along the signal path B.

With the conceptual illustration and explanation of FIG. 3 in mind, in some embodiments, the delay path B may be implemented as shown in FIG. 2. That is, the first stage L1 of the delay path B may include a P-type transistor MP1 and N-type transistors MN1, MN2, and MN3. Here, the transistor MP1 and the transistor MN1 may be connected in series to act as an inverter circuit receiving the clock signal CK at a node, and inverting the clock signal CK to generate an inverted clock signal applied to an input node N1. Thus, in FIG. 2, the transistor MP1 may be connected between a power supply terminal (e.g., VDD) and the input node N1. The transistor MN1 has a drain connected to the input node N1. The transistor MN2 may be connected between the input node N1 and ground.

The feedback path C may be connected to a gate of the transistor MN2.

The transistor MN3 may be connected between a source of the transistor MN1 and ground, wherein an input node of the last stage Ln of the delay path B may be connected to a gate of the transistor MN3.

With this configuration, the pulse generator 100 of FIG. 2 may adjust a width of the pulse signal P using the stages of the delay path B, and may also smooth the shape of the resulting pulse signal using a previously-generated version of the pulse signal P as an applied input signal to the delay path B.

The scan hold buffer circuit 200 of the pulse-based flip flop circuit 1 of FIG. 2 may include a series of inverter circuits configured to delay a scan input signal SI in order to generate a delayed scan input signal. That is, the pulse-based flip flop circuit 1—having a negative setup time characteristic—may nonetheless delay the scan input signal SI by a preset delay time in order to provide a stable hold time characteristic.

The latch circuit 300 of the pulse-based flip flop circuit 1 of FIG. 2 may generally include an input unit and a latch unit. Here, the input unit may provide (or output) the delayed scan input signal SI or data signal D9 (as an intermediate signal) to an intermediate node (e.g., N31) in response to a scan enable signal SE. The latch unit may then latch the intermediate signal apparent at the intermediate node N31 in accordance with the pulse signal P and an inverted pulse signal PN in order to provide an output signal (e.g., a QN signal) of the latch circuit. In this regard, a latched version of the intermediate signal (e.g., a latched signal) may be apparent at the latch node N32.

In some embodiments, the input unit may include an inverter circuit 311 and two (2) tri-state inverter circuits 312 and 313, wherein the inverter circuit 311 may invert the scan enable signal SE. The tri-state inverter circuit 313 may invert the delayed scan input signal SI in response to the scan enable signal SE and an inverted scan enable signal nSE in order to output an inverted-delayed scan input signal. The tri-state inverter circuit 312 may invert the data signal D in response to the scan enable signal SE and the inverted scan enable signal nSE in order to output an inverted data signal.

In some embodiments, the latch unit may include two (2) tri-state inverter circuits 321, 322, an inverter circuit 323, and an output driver 330. The tri-state inverter circuit 321 may invert the intermediate signal apparent at the intermediate node N31 in response to the pulse signal P and the inverted pulse signal PN in order to output an inverted version of the intermediate signal—which may then be apparent at the latch node N32 as the latched signal. Thus, the output driver 330 may drive the latched signal apparent at the latch node N32 as the output (or QN) signal of the latch circuit 300. In this regard, the inverter circuit 323 may invert the latched signal at the latch node N32 and output the inverted latched signal. The tri-state inverter circuit 322 may (re)invert the inverted version of the latched signal provided by the inverter circuit 323 in response to the pulse signal P and the inverted pulse signal PN in order to provide the inverted version of the latched signal to the latch node N32. In this manner, the tri-state circuit 322 may hold an output signal generated during a previous operational period at the output node of the inverter circuit 323 and the tri-state circuit 322 and may output the output signal according to a next pulse signal P and the inverted pulse signal PN.

Figure 4:
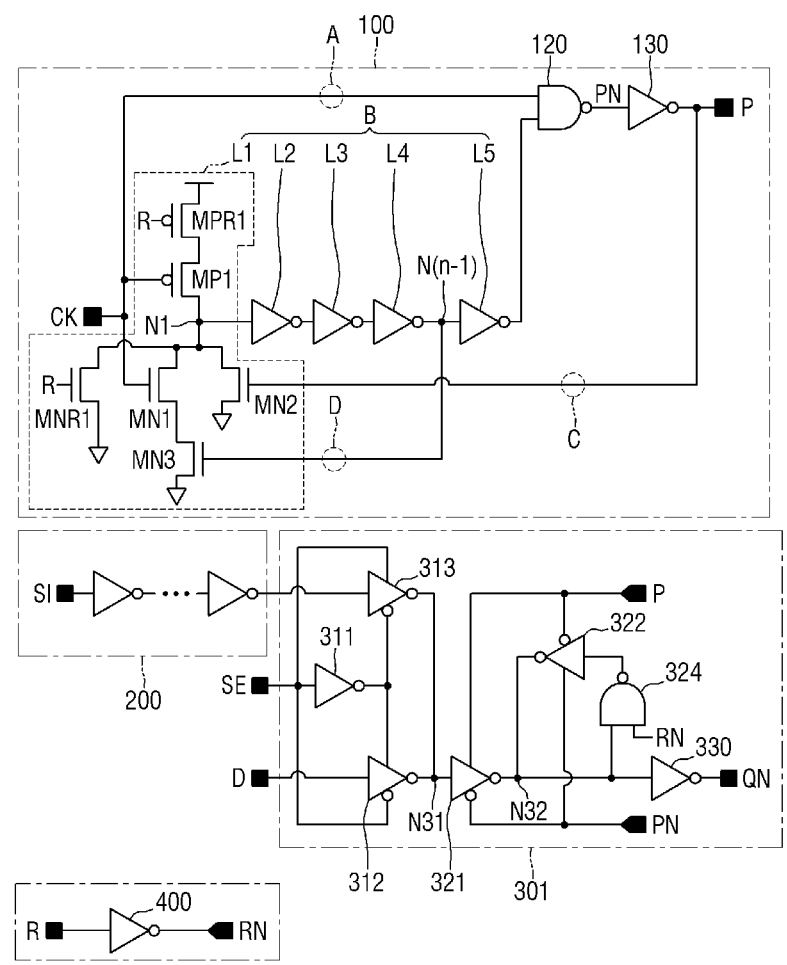
FIGS. 4 and 5 are respective circuit diagrams illustrating pulse-based flip flop circuits according to embodiments of the inventive concept.

FIG. 4 is a circuit diagram illustrating a pulse-based flip flop circuit according to embodiments of the inventive concept. For convenience of description, only material differences between the embodiments of FIGS. 3 and 4 will be highlighted.

Referring to FIG. 4, the delay path B of pulse generator 100 may be reset in response to a reset signal R. That is, the first stage among the stages of the delay path B may further include reset transistors MPR1 and MNR1 associated with the reset signal.

For example, a first reset transistor MPR1 may be connected between a source of the transistor MP1 and the power supply terminal VDD, and may be controlled by the reset signal R applied to its gate. A second reset transistor MNR1 may be connected between the input node N1 and ground, and may be controlled by the reset signal R applied to its gate.

An inverted reset signal RN may be generated by inverting the reset signal R using an inverter circuit 400.

Accordingly, when the reset signal R is activated (e.g., R=1), an inverted version of the reset signal RN (e.g., R=0) is applied and the first stage L1 of the delay path B will not communicate (or pass) the clock signal CK to a next stage, and is thus reset. In some embodiments including the reset transistor(s) and as conceptually illustrated in FIG. 3, either the reset signal R or the inverted reset signal RN may alternately be applied to the stages of the delay path B. That is, odd-numbered stage(s) may be reset with the reset signal R and even-numbered stage(s) may be reset with the inverted reset signal RN. And with the illustrated configuration, because the last stage of the delay path B is an odd-numbered stage, the last stage will be reset with the reset signal R.

Referring to FIG. 4, the latch circuit 301 may further include a NAND circuit 324 performing a NAND operation on the inverted reset signal RN and the latched signal apparent at the of the latch node N32 instead of the inverter circuit 323 in a path that holds the latched signal at the latch node N32. That is, when the reset signal R is activated, the delay path B of the pulse generator circuit 100 may be reset, such that the output signal generated by a previously-performed operation during a previous period of time and held in the latch circuit 301 may also be reset in response to the inverted reset signal.

Figure 5:
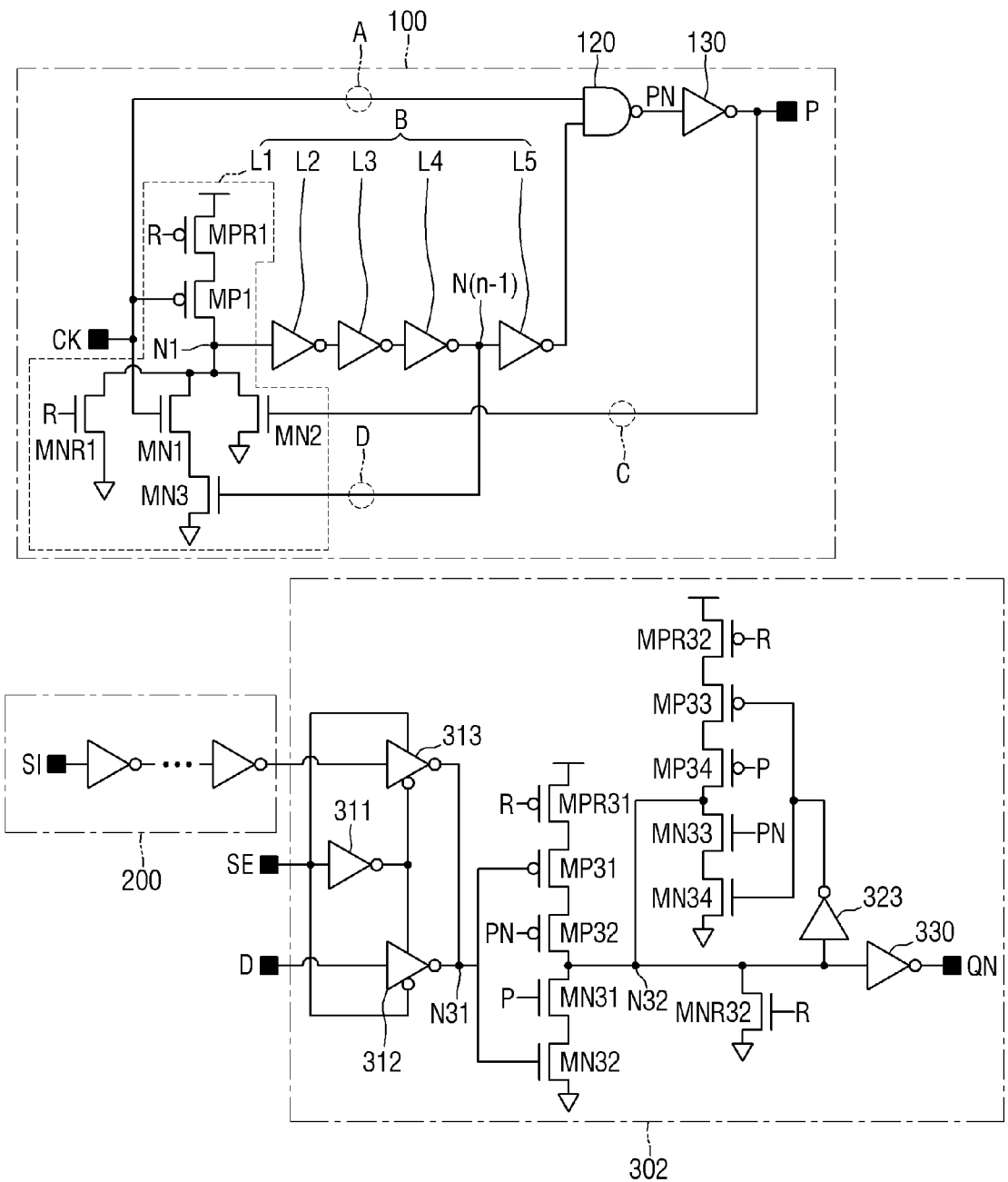

FIG. 5 is a circuit diagram illustrating a pulse-based flip flop circuit according to embodiments of the inventive concept.

As compared with the embodiment of FIG. 4, the embodiment of FIG. 5 includes a latch circuit 302 different from the latch circuit 301 that may be reset by the inverted reset signal RN. For convenience of description, only material differences between the embodiments of FIGS. 4 and 5 will be highlighted.

The latch unit of the latch circuit 302 may include a P-type reset transistor MPR31 connected to an input tri-state inverter circuit MP31, MP32, MN31, and MN32, an N-type reset transistor MNR32 connected to an output N32 of the input-tri state inverter circuit, an inverter circuit 323, a feedback tri-state inverter circuit MP33, MP34, MN33, MN34 and a P-type reset transistor MPR32 connected to the feedback tri-state inverter circuit.

For example, the latch unit may include three P-type transistors MPR31, MP31, and MP32 and two N-type transistors MN31 and MN32 as stacked between the power supply terminal and ground. The reset transistor MPR31 may be connected between the power supply terminal and a source of the transistor MP31 and may be gated with the reset signal R. The reset transistor MNR32 may be connected between latch node N32 and ground and may be gated with the reset signal R.

In the feedback tri-state inverter circuit, the P-type transistors MPR32, MP33, and MP34 and the two N-type transistors MN33 and MN34 are connected to each other in a stack configuration. With this configuration, the transistor MPR32 may be connected between a source of the transistor MP33 and the power supply terminal and may be gated with the reset signal R.

With this configuration, the inverted pulse signal PN is applied to gates of the transistor MP32 and the transistor MN33, the pulse signal P is applied to gates of the transistors MN31 and MP34, and gates of the transistors MP31 and MN32 may be connected to the intermediate node N31. A common node of the transistors MP32 and MN31 may be connected to the N32 node as an output node. A common node of the transistors MP34 and MN33 may be connected to the latch node N32, and an output node of the inverter circuit 323 may be connected to gates of transistors MP33 and MN34.

Figure 6:
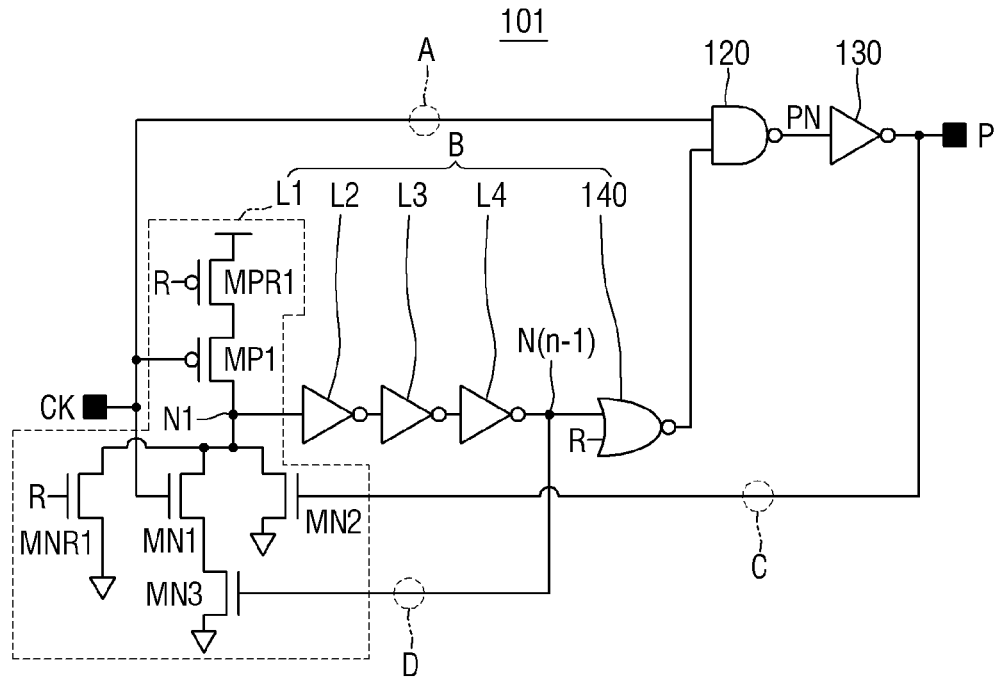
FIGS. 6, 7 and 8 are respective circuit diagrams illustrating in various embodiments a pulse generator for a pulse-based flip flop according to embodiments of the inventive concept.

FIG. 6 is a circuit diagram illustrating a pulse generator circuit 101 that may be incorporated in a pulse-based flip flop circuit according to embodiments of the inventive concept.

Referring to FIG. 6 by way of comparison with the pulse generator circuit of FIG. 2, the pulse generator circuit 101 may further include an NOR circuit 140. For convenience of description, only material differences between the embodiments of FIGS. 2 and 6 will be highlighted.

The NOR circuit 140 may be used instead of the inverter circuit of the last stage Ln among the stages of the delay path B. The NOR circuit 140 may perform a NOR operation for the reset signal R and a signal apparent at an N(n−1) node along the delay path B (e.g., an output signal provided by a previous stage), wherein the NOR operation result is applied as the second input to the NAND circuit 120.

Here, because the NOR circuit 140 is disposed immediately in front of the NAND circuit 120, and the NOR operation result is determined by the reset signal R, the pulse signal or the inverted pulse signal may be most quickly determined by the state of the reset signal R. And this outcome may prevent unintentional short-circuit power consumption during a time period in which the clock signal CK is delayed by the delay path B.

Figure 7:
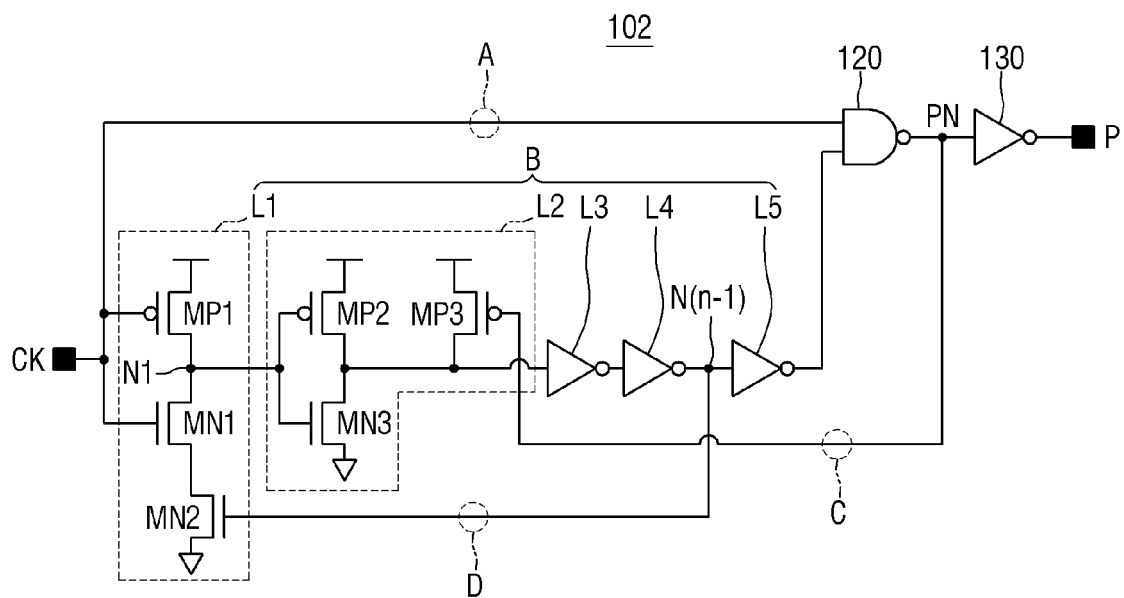

FIG. 7 is a circuit diagram illustrating a pulse generator circuit 102 that may be incorporated in a pulse-based flip flop circuit according to embodiments of the inventive concept.

Referring to FIG. 7, the pulse generator circuit 102 may use the inverted pulse signal PN as a control signal provided to the delay path B through a first feedback path C.

In this regard, the delay path B of the pulse generator circuit 102 may include an inverter circuit MP1 and MN1 that inverts the clock signal CK to provide the inverted clock signal at the input node N1, a transistor MN2 gated by an input signal applied to the last stage of the delay path B, an inverter circuit MP2 and MN3, a transistor MP3 connected between an output node of the inverter circuit MP2 and MN3 and the power supply terminal and having a gate connected to the first feedback path C, as well as a number stages series connected to the output node of the inverter circuit MP2 and MN3. Here, the transistors MP1, MN1, and MN2 may be included in a first stage L1, wherein the transistor MN2 is gated by a second feedback path D, which may be an input signal (e.g., N(n−1)) applied to the last stage of the delay path B. A second stage L2 (e.g., an intermediate stage between a first stage and a last stage) of the delay path B may include the transistors MP2, MP3 and MN3, wherein the transistor MP3 is gated by the first feedback signal C (e.g., the inverted pulse signal PN provided by the NAND circuit 120. Each of a third stage L3 stage, a fourth stage L4, and a fifth stage L5 stage may be implemented as an inverter circuit.

Figure 8:
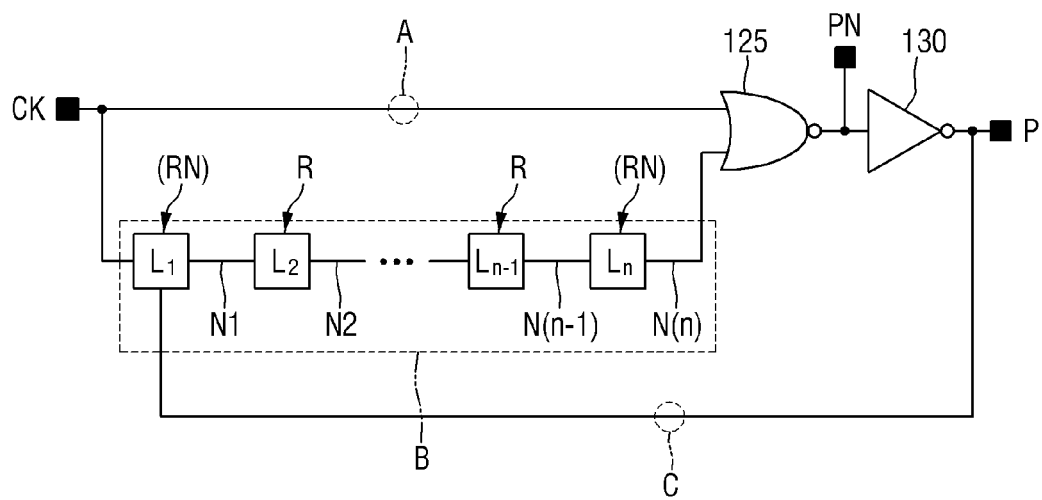

FIG. 8 is another diagram conceptually illustrating a pulse generator circuit 103 according to embodiments of the inventive concept and may be compared with the conceptual diagram of FIG. 3.

Referring to FIGS. 3 and 8, the pulse generator circuit 103 may include the direct path A, the delay path B, a NOR circuit 125 (instead of the NAND circuit 120 of FIG. 3), the inverter circuit 130 and the feedback path C.

With this configuration, for example, the pulse generator circuit 103 of FIG. 8 may operate in response to a falling edge of the clock signal CK (e.g., as another example of an active clock edge) in contrast to the pulse generator circuit 100 of FIG. 3 that operates in response to the rising edge of the clock signal CK.

Figure 9:
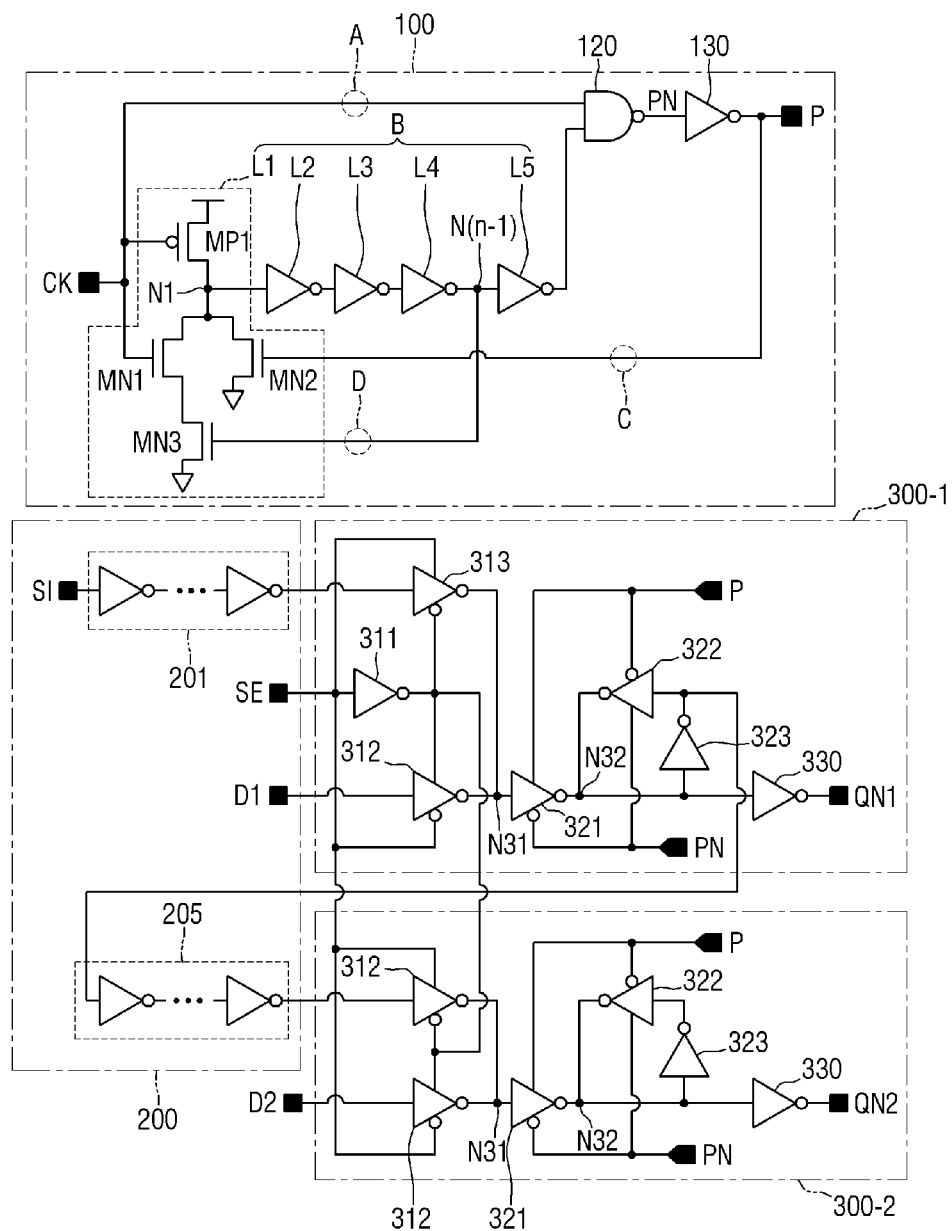
FIG. 9 is a circuit diagram illustrating a multi-bit flip flop according to embodiments of the inventive concept.

FIG. 9 is a circuit diagram illustrating a multi-bit flip flop circuit capable of processing multi-bit data according to embodiments of the inventive concept. Here, it is assumed that the pulse generator circuit 100 previously described in relation to FIG. 2 is incorporated in the multi-bi flip flop of FIG. 9.

However, the multi-bit flip flop circuit of FIG. 9 may include a scan hold circuit 200 including two or more scan hold buffer circuits (e.g., 201 and 205), as well as two or more latch circuits (e.g., 300-1 and 300-2). Here, only two scan hold buffer circuits and two latch circuits are shown, but those skilled in the art will recognize that any reasonable number (e.g., wherein m is greater than 1) of scan hold buffer circuits and latch circuits may be included in embodiments of the inventive concept.

In this regard, the scan hold buffer circuits and the latch circuits may be serially connected to collectively form a scan chain. Thus, in some embodiments like the one illustrated in FIG. 9, an output of the first scan hold buffer circuit 201 may be connected as an input signal to the first latch circuit 300-1, and an output signal of the first latch circuit 300_1 (e.g., an output of the feedback inverter circuit 323) may be connected as an input signal to the second scan hold buffer circuit 205. In some embodiments of this nature, the first scan hold buffer circuit 201 may include an even number of buffer circuits and the second scan hold buffer circuit 205 may include an odd number of buffer circuits.

Alternately, the latch signal apparent at the latch node N32 of the first latch circuit 300-1 may be connected as an input to the second scan hold buffer circuit 205. With this configuration, the first scan hold buffer circuit 301 may include an even number of buffer circuits and the second scan hold buffer circuit 205 may include an even number of buffer circuits.

Further, an output of the second scan hold buffer circuit 205 may be connected to an input of the second latch circuit 300-2, and with this configuration, a first output signal QN1 provided by the first latch circuit 300-1 and a second output signal QN2 provided by the second latch circuit 300-2 may be combined to generate a multi-bit output signal.

Figure 10:
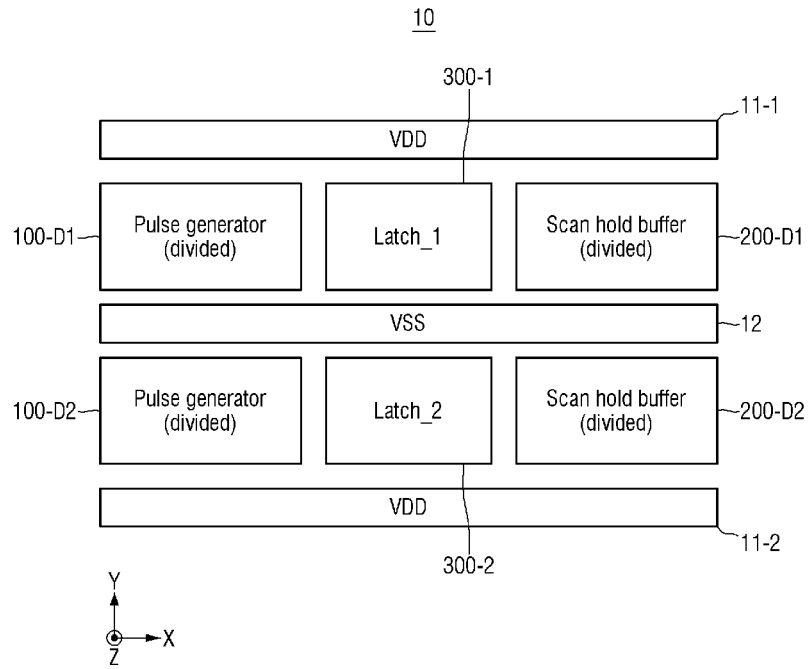
FIGS. 10, 11, 12 and 13 are respective, conceptual plan (or top-down) views illustrating various arrangements of standard cells for multi-bit flip flop(s) according to embodiments of the inventive concept.
Figure 11:
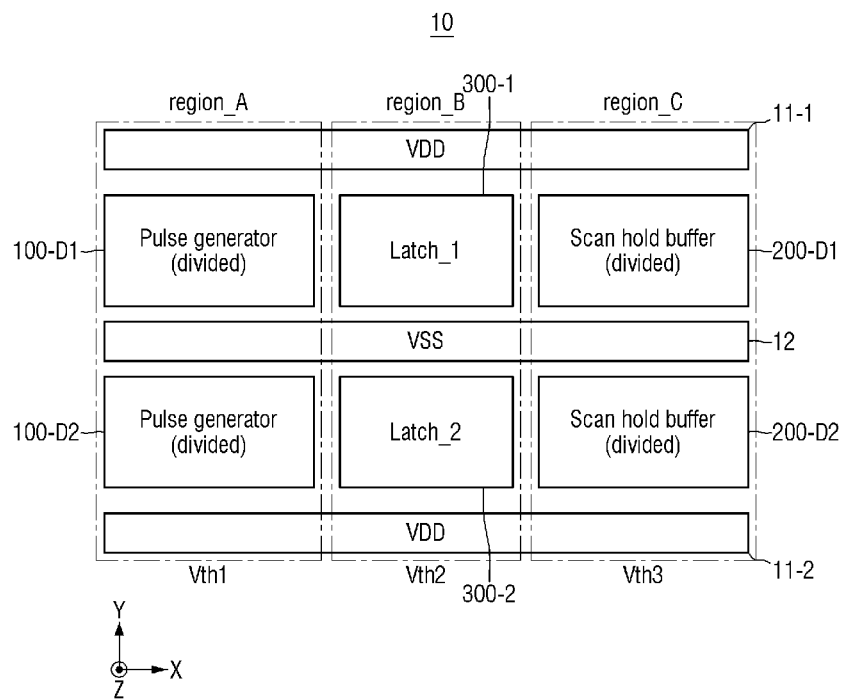

FIGS. 10 and 11 are respective layout diagrams (or plan views) illustrating exemplary arrangements of standard cell(s) for a multi-bit flip flop circuit according to embodiments of the inventive concept.

Referring to FIGS. 10 and 11, various components of the multi-bit flip flop circuit may be arranged in relation to multiple physical rows. Here, an arbitrary geometric (or coordinate) space—defined e.g., by a first (or 'X') horizontal direction, a second (or 'Y') horizontal direction intersecting the first horizontal direction, and a vertical (or 'Z') direction intersecting both the first and second horizontal directions—is assumed to more clearly described the relevant embodiments and component interrelationships.

Given this assumed geometric space, two (2), spaced-apart in the second horizontal direction, power supply metal lines may extend in parallel in the first horizontal direction. (Hereinafter, such an arrangement of power supply metal lines may be referred to as "adjacent metal lines" defining (or "bounding") a respective row among a number of similarly defined (or "bounded") rows). Here, each of the adjacent metal lines may supply a power supply voltage such as VDD or VSS. With a defined row, various multi-bit flip flop components may be arranged in the first horizontal direction between the two adjacent metal lines.

FIG. 10 is a layout diagram of a 2-bit, multi-bit flip flop circuit 10. Referring to FIGS. 9 and 10, a first divisional pulse generator 100-D1, the first latch circuit 300-1, and a first scan hold buffer 200-D1 may be disposed in a first row between a first pair of adjacent metal lines including a first power supply metal line VDD 11-1 and a second power supply metal line VSS 12, and a second divisional pulse generator 100-D2, the second latch circuit 300-2, and a second scan hold buffer 200-D2 may be disposed in a second row between a second pair of adjacent metal lines including the second power supply metal line VSS 12 and a third power supply metal line VDD 11-2.

With this configuration, the first latch circuit 300-1 and the second latch circuit 300-2 may be arranged in substantial alignment in the second horizontal direction. That is, at least a portion of the first latch circuit 300-1 and at least a portion of the second latch circuit 300-2 may be aligned in the second horizontal direction. Similarly, the first divisional pulse generator 100-D1 and the second divisional pulse generator 100-D2 may arranged in substantial alignment in the second horizontal direction, and the first scan hold buffer 200-D1 and the second scan hold buffer 200-D2 may be arranged in substantial alignment in the second horizontal direction.

Given the foregoing configuration, a pulse-based flip flop circuit according to embodiments of the inventive concept may include similar components arranged in substantial alignment the second horizontal direction. Therefore similar components—as arranged in substantial alignment in the second horizontal direction—may operate in response to a common threshold voltage.

FIG. 11 is another layout diagram of the 2-bit, multi-bit flip flop circuit 10 further illustrating additional aspects. In FIG. 11, a first columnar region A including the divisional pulse generators 100-D1 and 100-D2 may operate in accordance with a first threshold voltage Vth1; a second columnar region B including the latch circuits 300-1 and 300-2 may operate in accordance with a second threshold voltage Vth2; and a third columnar region C including the divisional scan hold buffers 200-D1 and 200-D2 may operate in accordance with a third threshold voltage Vth. In some embodiments, the first threshold voltage Vth1, the second threshold voltage Vth2, and the third threshold voltage Vth3 may be the same voltage. Alternately, in other embodiments, at least one the first threshold voltage Vth1, the second threshold voltage Vth2, and the third threshold voltage Vth3 may be different from another one of the first threshold voltage Vth1, the second threshold voltage Vth2, and the third threshold voltage Vth3 (e.g., Vth1>Vth2>Vth3, or Vth1<Vth2<Vth3).

Figure 12:
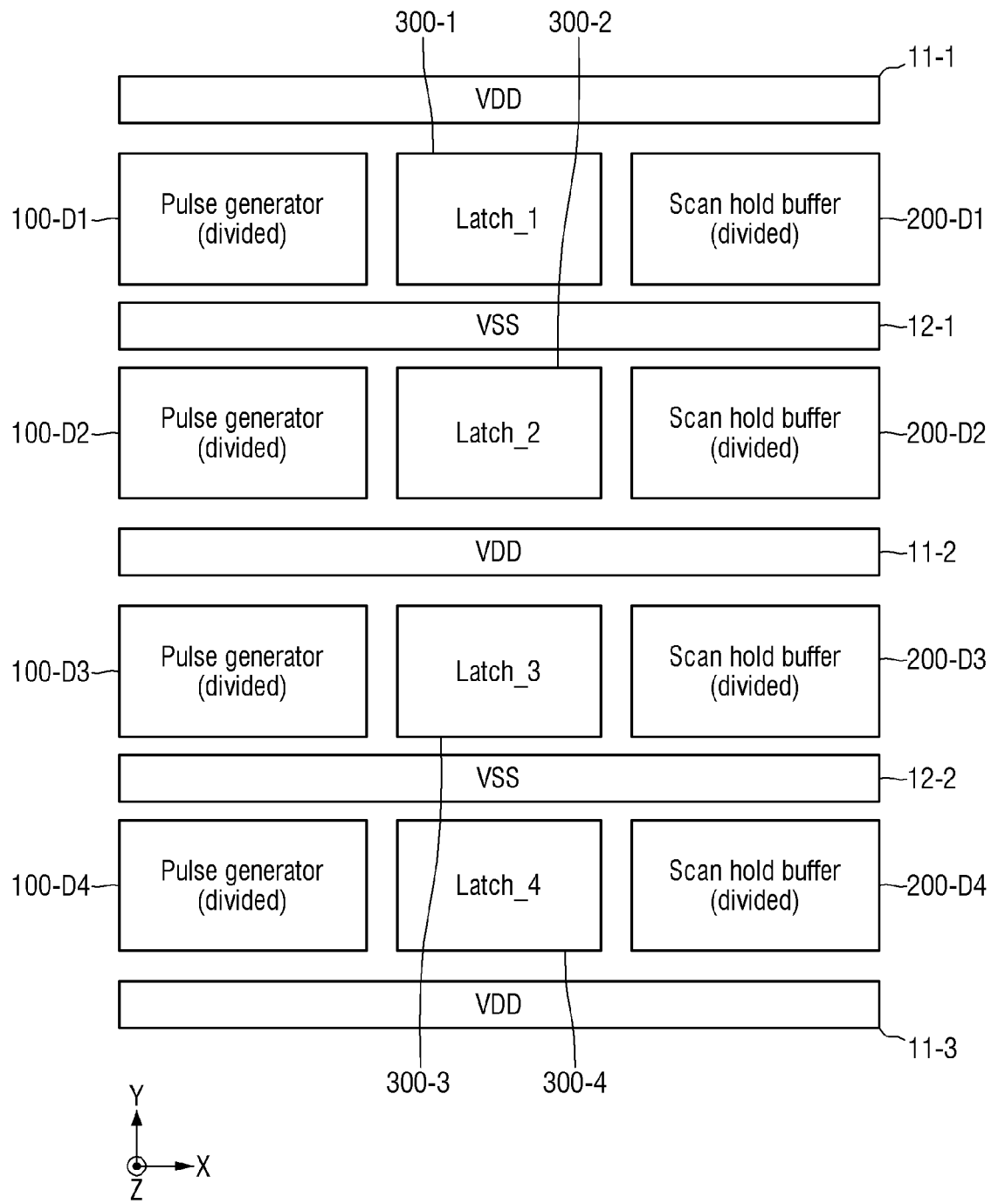

FIG. 12 are respective layout diagrams (or plan views) illustrating standard cell(s) of a multi-bit flip flop according to embodiments of the inventive concept. That is, each of FIG. 12 and FIG. 13 illustrates a 4-bit, multi-bit flip flop circuit including four (4) latch circuits, four (4) divisional pulse generators 100-D, and four (4) divisional scan hold buffers 200-D.

Referring to FIG. 12, the 4-bit flip flop circuit may include four rows, wherein each row arranges a divisional pulse generator 100-Dk, a latch circuit 300-k, and a divisional scan hold buffer 200-Dk in the first horizontal direction. Further, the respective divisional pulse generators are arranged substantially in alignment in the second horizontal direction, the respective latch circuits arranged substantially in alignment in the second horizontal direction, and the respective divisional scan hold buffers are arranged substantially in alignment in the second horizontal direction.

Figure 13:
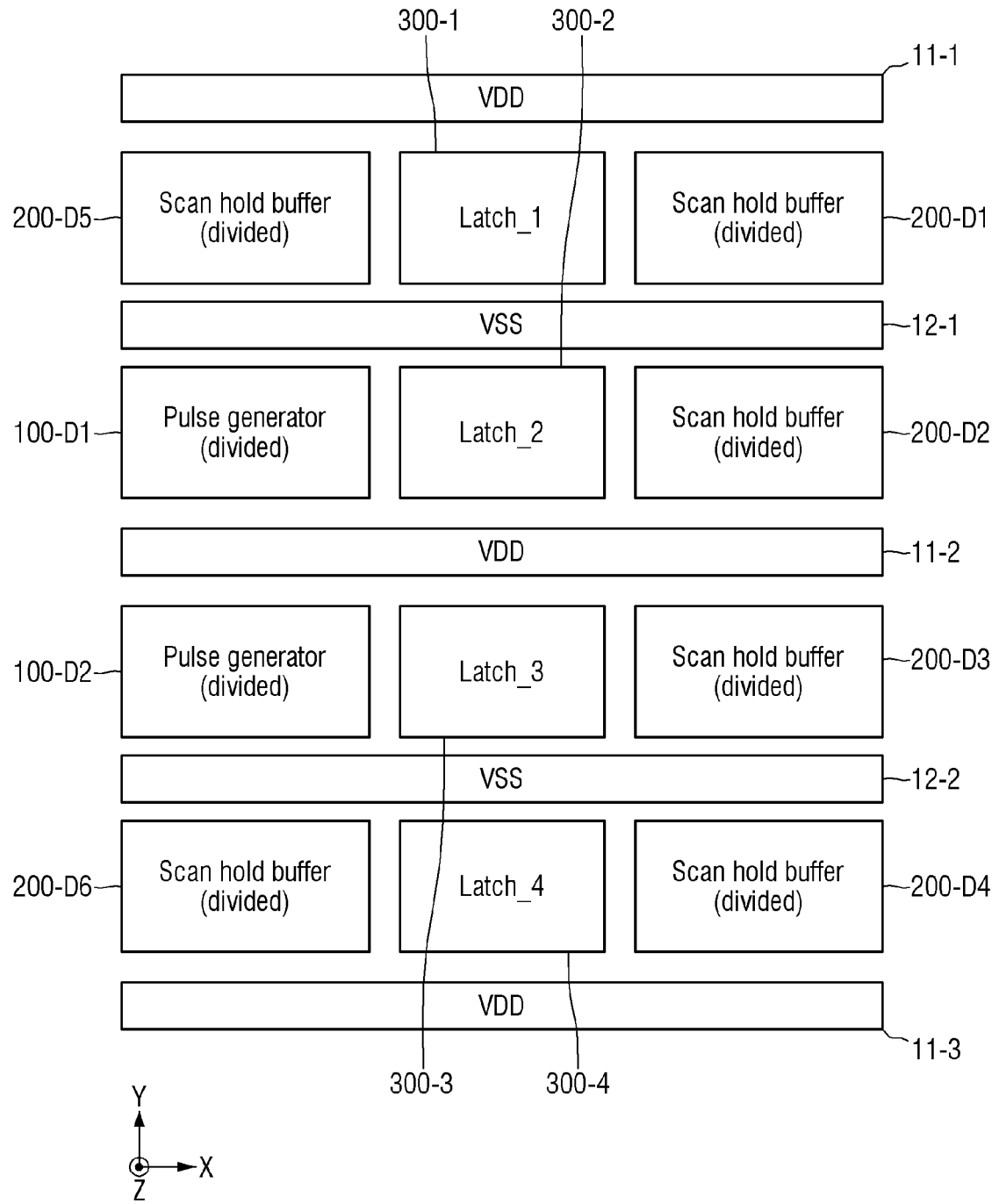

Referring to FIG. 13, the 4-bit flip flop circuit may be implemented in relation to two (2) divisional pulse generators. Thus, in each row, a divisional pulse generator 100-Dk, a latch circuit 300-k, a divisional scan hold buffer 200-Dk may be arranged in the first horizontal direction, where 'k' is a natural number. Alternately, the 4-bit flip flop circuit may include a divisional scan hold buffer 200-Dk, a latch circuit 300-k, and a divisional scan hold buffer 200-Dk.

Due to a nature of the pulse-based flip flop circuit, the scan input signal SI should be delayed by a preset delay time, and each scan hold buffer included therein per each latch circuit to constitute a scan chain. Thus, a size of the scan hold buffer 200 may be larger than that of the pulse generator 100. Therefore, the divisional pulse generator 100-Dk may be first disposed and then the divisional scan hold buffer 200-Dk may be disposed in a remaining area.

Figure 14:
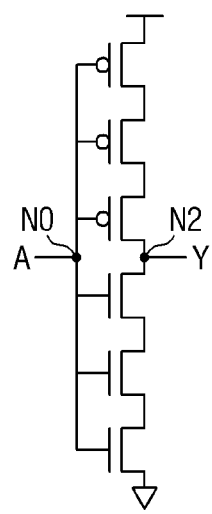
FIGS. 14 and 16 are respective circuit diagrams illustrating a multi-stack inverter that may be implemented in a delay path of a pulse-based flip flop according to embodiments of the inventive concept.
Figure 15:
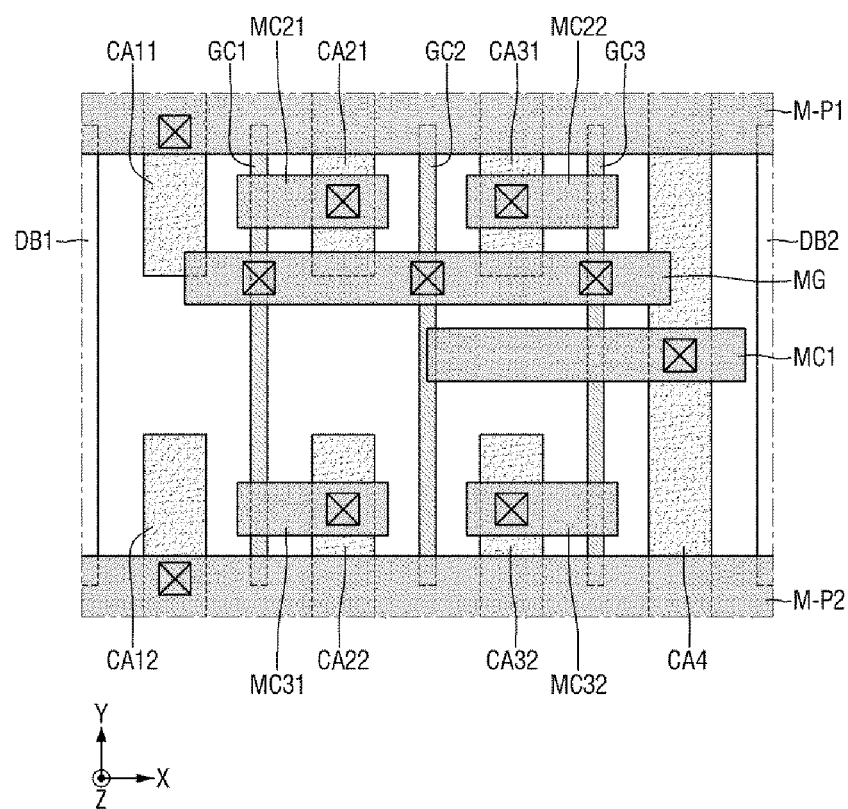
FIG. 15 is a plan (or top-down) view of the multi-stack inverter of FIG. 14.

FIG. 14 is a circuit diagram illustrating a multi-stack inverter that may be incorporated in a delay path of a pulse-based flip flop according to embodiments of the inventive concept, and FIG. 15 is a plan view of the multi-stack inverter of FIG. 14.

Each of the respective stages included in the delay path (e.g., the delay path B of FIG. 3) may include a delay inverter circuit, wherein each of the respective delay inverter circuits may be implemented as the multi-stack inverter of FIG. 14. That is, as further illustrated in the plan view of FIG. 15, the multi-stack inverter is formed between at least two diffusion brake areas DB1 and DB2 spaced apart in the first horizontal direction and extending in parallel in the second horizontal direction.

That is, referring to FIGS. 14 and 15, gate electrodes GC1, GC2, and GC3 may be spaced apart in the first horizontal direction, extend in the second horizontal direction, and may be arranged between the first diffusion brake area DB1 and the second diffusion brake area DB2. Here, the spacing(s) between adjacent gate electrodes and/or spacing(s) between a gate electrode and a diffusion brake area may be referred to as critical poly pitch (1 CPP).

A source/drain contact CA extending in the second horizontal direction may be formed between two adjacent gate electrodes. Some source/drain contacts may be disconnected and divided into two portions in the second horizontal direction which may be spaced apart in the second horizontal direction. Other source/drain contacts may be continuous in the second horizontal direction. Here, first disconnected source/drain contacts CA11 and CA12 may be disposed between the first diffusion brake area DB1 and the gate electrode GC1. Second disconnected source/drain contacts CA21 and CA22 may be disposed between the first gate electrode GC1 and the second gate electrode GC2. Third disconnected source/drain contacts CA31 and CA32 may be disposed between the second gate electrode GC2 and the third gate electrode GC3. A continuous source/drain contact CA4 may be disposed between the third gate electrode GC3 and the second diffusion brake area DB2.

Each of the gate electrodes GC1, GC2, and GC3 may be electrically connected to one input metal electrode MG extending in the first horizontal direction via a gate via. The continuous source/drain contact CA4 may be connected to an output metal electrode MC1 extending in the first direction via a source/drain via.

The multi-stack inverter may include first dummy metal patterns MC21 and MC22 between the input metal electrode MG and a first power supply metal line M-P1, and second dummy metal patterns MC31 and MC32 between the output metal electrode MC1 and a second power supply metal line M-P2.

The illustrated example of FIGS. 14 and 15, the multi-stack inverter includes six (6) transistors (e.g., three P-type transistors, and three N-type transistors). However, when a number of stacks in the pulse generator 100 is adjusted, the dummy metal patterns MC21 and MC22 or MC31 and MC32 may be used without entirely changing a design for an installation space of the metal patterns extending in the first direction. See, for example, the illustrated example of FIGS. 16 and 17.

Figure 16:
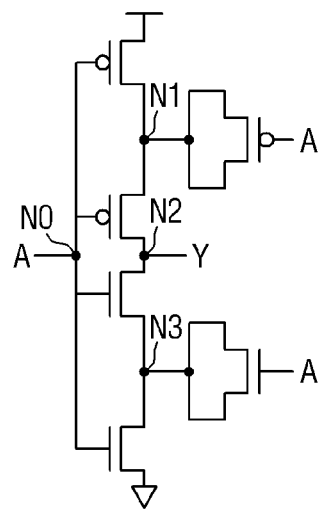
Figure 17:
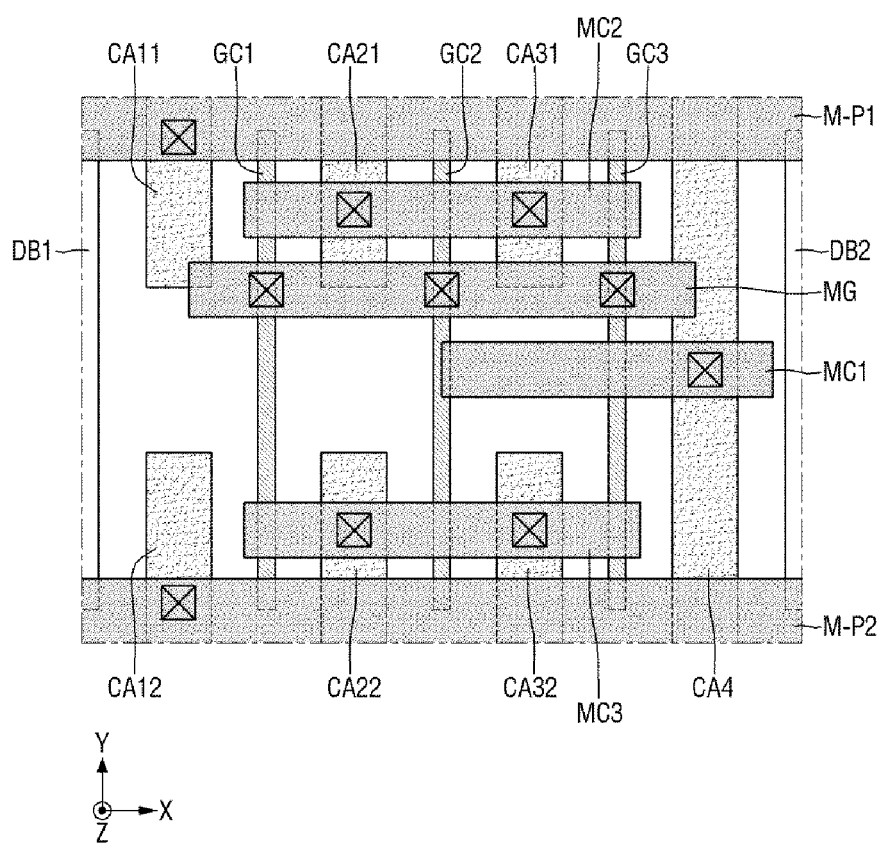
FIG. 17 is a plan view of the multi-stack inverter of FIG. 16.

FIG. 16 is another circuit diagram illustrating another multi-stack inverter that may be incorporated in a delay path of a pulse-based flip flop according to embodiments of the inventive concept, and FIG. 17 is a plan view of the multi-stack inverter of FIG. 16.

Of particular note, when a number of stacks of the delay inverter circuit included in each stage is adjusted to control a width of the pulse signal, the number thereof may be reduced by short-circuiting (or "shorting") a source and a drain of at least one of transistors in a stack.

Referring to FIG. 16, it is assumed that the multi-stack inverter of FIG. 14 including three (3) stacks is to be changed to a multi-stack inverter including two (2) stacks. In this regard, for example, a source and a drain of a middle P-type transistor in the three (3) P-type transistors stack and a middle N-type transistor in the three (3) N-type transistors stack may be shorted (e.g., node N1, N3). Referring to FIG. 17, the first dummy metal pattern pair MC21 and MC22 described in FIG. 15 may be connected with the metal pattern MC2, and the second dummy metal pattern pair MC31 and MC32 may be connected with the metal pattern MC3.

That is, the dummy metal pattern pair may be pre-formed during design of the layout. Afterwards, when adjusting a number of stacks for each delay inverter circuit in a particular pulse-based flip flop circuit, a standard cell may be replaced at low cost by simply connecting the dummy metal pattern pair with a corresponding metal pattern without requirement to materially change the layout.

Although the embodiments of the inventive concept have been described above with reference to the accompanying drawings, those skilled in the art will appreciate that the inventive concept will be variously implemented without departing from the scope of the following claims.

What is claimed is:
1. A pulse-based flip flop circuit, comprising:
a pulse generator circuit configured to generate a pulse signal and an inverted pulse signal;

a scan hold buffer configured to hold a scan input signal for a delay time; and a latch circuit including an intermediate node receiving one of a data signal and the scan input signal provided by the scan hold buffer in response to a scan enable signal, wherein the pulse generator circuit comprises an input node, a direct path providing a clock signal as a direct path input to a NAND circuit, a delay path including a number of stages configured to delay the clock signal and provide a delayed clock signal as a delay path input to the NAND circuit, wherein the NAND circuit performs a NAND operation on the direct path input and the delay path input to generate the inverted pulse signal, and a feedback path providing the pulse signal to a first stage among the number of stages of the delay path, and wherein the first stage receives the clock signal and inverts the clock signal to provide an inverted clock signal, and the first stage includes a first N-type transistor connected between the input node and ground, and a gate of the first N-type transistor receives the pulse signal via the feedback path.

2. The pulse-based flip flop circuit of claim 1, wherein the number of stages of the delay path is an odd number greater than 2.

3. The pulse-based flip flop circuit of claim 1, wherein the first stage further includes a second N-type transistor connected between the first stage and ground, and a gate of the second N-type transistor is connected to an input of a last stage among the number of stages of the delay path.

4. The pulse-based flip flop circuit of claim 1, wherein the latch circuit comprises:

an input unit configured to provide the one of the data signal and the scan input signal provided by the scan hold buffer to the intermediate node as an intermediate signal in response to the scan enable signal; and a latch unit configured to latch the intermediate signal as an output signal of the pulse-based flip flop circuit in response to the pulse signal and the inverted pulse signal.

5. The pulse-based flip flop circuit of claim 4, wherein the input unit of the latch circuit comprises:

an inverter circuit inverting the scan enable signal to provide an inverted scan enable signal;

a first tri-state inverter inverting the scan input signal provided by the scan hold buffer to provide an inverted scan input signal in response to the inverted scan enable signal and the scan enable signal; and a second tri-state inverter inverting the data signal to provide an inverted data signal in response to the inverted scan enable signal and the scan enable signal.

6. The pulse-based flip flop circuit of claim 5, wherein the latch unit of the latch circuit comprises:

an output driver driving the output signal of the pulse-based flip flop circuit;

a third tri-state inverter providing the intermediate signal to a latch node as a latch signal in response to the pulse signal and the inverted pulse signal;

an inverter inverting the latch signal to provide an inverted latch signal; and a fourth tri-state inverter inverting the inverted latch signal to provide the latch signal to an input of the output driver in response to the pulse signal and the inverted pulse signal.

7. The pulse-based flip flop circuit of claim 1, wherein, the scan hold buffer includes at least a first scan hold buffer circuit and a second scan hold buffer circuit, the latch circuit includes at least a first latch circuit connected to the first scan hold buffer circuit and a second latch circuit connected to the second scan hold buffer circuit, and an output signal of the pulse-based flip flop circuit is a multi-bit signal.

8. The pulse-based flip flop circuit of claim 1, wherein the first stage further comprises:

a second N-type transistor connected between the first stage and ground and having a gate connected to an input of a last stage among the number of stages of the delay path;

a first P-type transistor connected to the input node and having a gate that receives the clock signal;

a first N-type reset transistor connected between the input node and ground and having a gate that receives a reset signal; and a first P-type reset transistor connected between the first P-type transistor and a power supply voltage and having a gate that receives the reset signal.

9. The pulse-based flip flop circuit of claim 8, wherein the latch circuit comprises:

an input unit configured to provide the one of the data signal and the scan input signal provided by the scan hold buffer to the intermediate node as an intermediate signal in response to the scan enable signal; and a latch unit configured to latch the intermediate signal as an output signal of the pulse-based flip flop circuit in response to the pulse signal and the inverted pulse signal, and reset the output signal in response to the reset signal.

10. A pulse generator circuit configured to provide a pulse signal to a latch circuit of a pulse-based flip flop circuit, the pulse generator circuit comprising:

a direct path receiving a clock signal and providing the clock signal as a direct path input to a NAND circuit;

a delay path receiving the clock signal and including an odd number of series-connected stages including at least a first stage, an intermediate stage, and a last stage;

a feedback path providing the pulse signal as a first feedback signal to the first stage; and an inverter inverting an inverted pulse signal to provide the pulse signal, wherein the series-connected stages delay the clock signal to provide a delay path input to the NAND circuit, and the NAND circuit performs a NAND operation on the direct path input and the delay path input to generate the inverted pulse signal, wherein the first stage comprises an input node, a first N-type transistor connected between the input node and ground and having a gate that receives the first feedback signal, and a second N-type transistor connected between the first stage and ground and having a gate that receives an input signal applied to the last stage as a second feedback signal.

11. The pulse generator circuit of claim 10, wherein the first stage receives the clock signal and inverts the clock signal to provide an inverted clock signal.

12. The pulse generator circuit of claim 11, further comprising:
   a NOR circuit that receives the delay path input and a reset signal and provides a reset version of the delay path input to the NAND circuit, and
   the first stage further comprises
   a first P-type transistor connected to the input node and having a gate that receives the clock signal,
   a first N-type reset transistor connected between the input node and ground and having a gate that receives a reset signal, and
   a first P-type reset transistor connected between the first P-type transistor and a power supply voltage and having a gate that receives the reset signal.

13. The pulse generator circuit of claim 10, wherein the delay path provides the clock signal as the delay path input to the NAND circuit through a NOR circuit.

14. A pulse-based multi-bit flip flop circuit, comprising:
   a first pair of adjacent metal lines including a first metal line and a second metal line bounding a first row extending in a first horizontal direction;
   a second pair of adjacent metal lines including the second metal line and a third metal line bounding a second row extending in the first horizontal direction, wherein the second row is adjacent to the first row in a second horizontal direction that intersects the first horizontal direction;
   a first divisional pulse generator, a first latch circuit, and a first scan hold buffer arranged in the first horizontal direction in the first row; and
   a second divisional pulse generator, a second latch circuit, and a second scan hold buffer arranged in the first horizontal direction in the second row,
   wherein an output of the first latch circuit is connected to an input of the second scan hold buffer.

15. The pulse-based multi-bit flip flop circuit of claim 14, wherein each of the first divisional pulse generator and the second divisional pulse generator comprises:
   a direct path receiving a clock signal and providing the clock signal as a direct path input to a NAND circuit;
   a delay path receiving the clock signal and including series-connected stages including at least a first stage and a last stage;
   an inverter receiving an inverted pulse signal and generating a pulse signal; and
   a feedback path providing the pulse signal as a feedback signal to the first stage,
   wherein the series-connected stages delay the clock signal to provide a delay path input to the NAND circuit, and the NAND circuit performs a NAND operation on the direct path input and the delay path input to generate the inverted pulse signal.

16. The pulse-based multi-bit flip flop circuit of claim 15, wherein the first divisional pulse generator and the second divisional pulse generator are arranged in alignment in the second horizontal direction;
   the first latch circuit and the second latch circuit are arranged in alignment in the second horizontal direction; and
   the first scan hold buffer and the second scan hold buffer are arranged in alignment in the second horizontal direction.

17. The pulse-based multi-bit flip flop circuit of claim 16, wherein the first divisional pulse generator and the second divisional pulse generator are arranged in a first columnar region and operate in accordance with a first threshold voltage;
   the first latch circuit and the second latch circuit are arranged in a second columnar region and operate in accordance with a second threshold voltage; and
   the first scan hold buffer and the second scan hold buffer are arranged in a third columnar region and operate in accordance with a third threshold voltage.

18. The pulse-based multi-bit flip flop circuit of claim 17, wherein one of the first threshold voltage, the second threshold voltage, and the third threshold voltage is different from another one of the first threshold voltage, the second threshold voltage, and the third threshold voltage.

* * * * *